US010270440B2

(12) United States Patent
Ptacek

(10) Patent No.: US 10,270,440 B2
(45) Date of Patent: Apr. 23, 2019

(54) OUTPUT DRIVER HAVING PULL-DOWN CAPABILITY

(71) Applicant: SEMICONDUCTOR COMPONENTS INDUSTRIES, LLC, Phoenix, AZ (US)

(72) Inventor: Karel Ptacek, Roznov Pod Radhostem (CZ)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 275 days.

(21) Appl. No.: 15/214,750

(22) Filed: Jul. 20, 2016

(65) Prior Publication Data

US 2018/0026629 A1   Jan. 25, 2018

(51) Int. Cl.
*H03K 17/687*  (2006.01)
*H02M 3/07*  (2006.01)
*H03K 19/003*  (2006.01)
*H03K 19/0185*  (2006.01)

(52) U.S. Cl.
CPC .......... *H03K 17/687* (2013.01); *H02M 3/07* (2013.01); *H03K 19/00361* (2013.01); *H03K 19/018585* (2013.01)

(58) Field of Classification Search
CPC ........... H03K 17/687; H03K 19/00361; H03K 19/018585; H02M 3/07

USPC ................ 327/108–112, 427, 434, 437, 333; 326/82, 83, 87, 14, 27; 363/50
See application file for complete search history.

(56) References Cited

U.S. PATENT DOCUMENTS

| | | | |
|---|---|---|---|
| 7,236,003 B2 | 6/2007 | Chellamuthu et al. | |
| 2007/0080708 A1* | 4/2007 | Chellamuthu | H03K 19/0013 326/33 |
| 2013/0333741 A1* | 12/2013 | Doutreloigne | H01L 31/02021 136/244 |
| 2015/0318851 A1* | 11/2015 | Roberts | H01L 25/18 327/109 |
| 2015/0365087 A1* | 12/2015 | Vogt | H03K 17/687 327/109 |

OTHER PUBLICATIONS

Semiconductor Components Industries, LLC, High Speed Dual MOSFET Drivers, Sep. 2014.

* cited by examiner

*Primary Examiner* — Thomas Skibinski
(74) *Attorney, Agent, or Firm* — AMPACC Law Group, PLLC

(57) ABSTRACT

An output driver includes a switching device having a first node coupled to a gate of a power switch and pulling down a voltage level of the gate of the power switch to prevent a premature turn-on of the power switch. A pull-down circuit is coupled to the switching device and keeping the switching device from being turned on to prevent the premature turn-on of the power switch.

20 Claims, 5 Drawing Sheets

US 10,270,440 B2

OUTPUT DRIVER HAVING PULL-DOWN CAPABILITY

BACKGROUND

This present disclosure relates to integrated circuit devices, and more particularly to integrated circuit devices including output driver circuits.

An output driver receives a low-power input signal from a controller and produces a high-power drive signal to control another circuit or component, e.g., a power metal-oxide-semiconductor field-effect transistor (MOSFET). When a high rate of a drain-source voltage (dv/dt) is supplied at a drain of the power MOSFET, a voltage across a gate-drain parasitic capacitance between the drain and a gate of the power MOSFET may cause a displacement current to flow from the drain to a gate of the power MOSFET. The displacement current may cause the gate-source voltage to exceed the threshold voltage of the power MOSFET and cause a false turn-on of the power MOSFET.

A conventional output driver includes a pull-down resistor coupled between a gate and a source of a power MOSFET to address the false turn-on. The pull-down resistor is typically provided with a low resistance value, e.g., when a threshold voltage of the power MOSFET is low, a value of a gate-drain parasitic capacitance is large, or both. However, the pull-down resistor having a low resistance value has high power consumption due to a leakage current.

DETAILED DESCRIPTION

Figure 1:
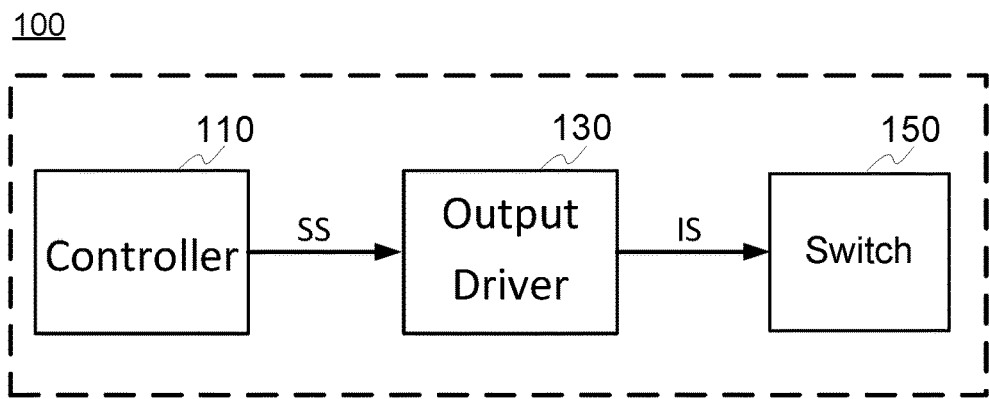
FIG. 1 illustrates a portion of a switched-mode power supply (SMPS) apparatus according to an embodiment.

FIG. 1 illustrates a portion of a switched-mode power supply (SMPS) apparatus 100. The SMPS apparatus 100 includes a controller 110, an output driver 130, and a switch 150.

The controller 110 outputs a switching signal SS to the output driver 130 in order to control the switch 150. In an embodiment, the controller 110 is a synchronous rectifier (SR) controller.

The output driver 130 receives the switching signal SS and applies an input signal IS to the switch 150. The input signal IS has a magnitude sufficiently large to achieve a desirable switching time for the switch 150. Although FIG. 1 shows the output driver 130 as being a separate device from the controller 110, embodiments of the present disclosure are not limited thereto. For example, the output driver 130 may be provided as a part of the controller 110 and the controller 110 may be provided as a part of a packaged device in other implementations.

The switch 150 is turned on or off according to the input signal IS from the output driver 130. In an embodiment, the switch 150 is a power switch or a circuit including a power switch. In another embodiment, the switch 150 is a power MOSFET transistor that replaces a secondary side diode in a resonant mode converter, or a circuit including such a power switch.

Figure 2:
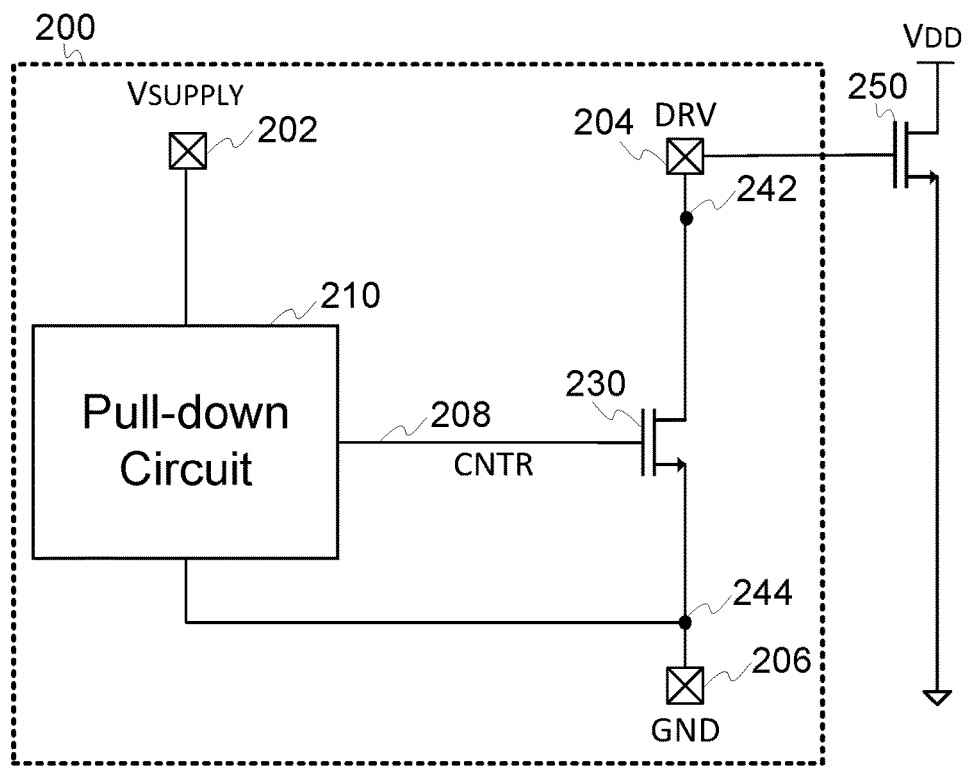
FIG. 2 illustrates a portion of an output driver suitable for use as the output driver of FIG. 1 according to an embodiment.

FIG. 2 illustrates a portion of an output driver 200 suitable for use as the output driver 130 of FIG. 1 according to an embodiment. The output driver 200 is coupled to an external switch 250, e.g., MOSFET switch, in order to drive the MOSFET switch 250. In an embodiment, the output driver 200 is configured to prevent a premature turn-on of the external MOSFET switch 250 due to the dv/dt triggering. The output driver 200 includes a pull-down circuit 210, a switching device 230, a first pad 202, a second pad 204, a third pad 206, a first node 242, and a second node 244.

The pull-down circuit 210 receives a supply voltage $V_{SUPPLY}$ through the first pad 202 and outputs a control signal CNTR to the switching device 230. The pull-down circuit 210 causes the switching device 230 to turn on or off according to the control signal CNTR.

The switching device 230 is provided between the second pad 204 and the third pad 206. When the switching device 230 is turned on, the switching device 230 pulls down a voltage at the first node 242 coupled to the second pad 204, and thus pulls down a gate voltage of the external MOSFET switch 250 coupled to the second pad 204. In an embodiment, the switching device 230 is a depletion type n-channel MOSFET transistor, which has a negative threshold voltage. In such an embodiment, a drain of the switching device 230 is coupled to the first node 242, and thus the pull-down circuit 210 is used to pull down the gate voltage of the external MOSFET switch 250. As a result, a gate-source voltage of the external MOSFET switch 250 is maintained at a level that is sufficiently low to prevent a premature turn-on of the external MOSFET switch 250 due to the dv/dt triggering.

When the control voltage CNTR becomes sufficiently negative, the switching device 230 is turned off. As a result, the pull-down circuit 210 is used to stop pulling down the gate voltage of the external MOSFET switch 250, and another portion (not shown) of the output driver starts to provide an input signal IS to the gate of the external MOSFET switch 250 through the second pad 204.

Figure 3:
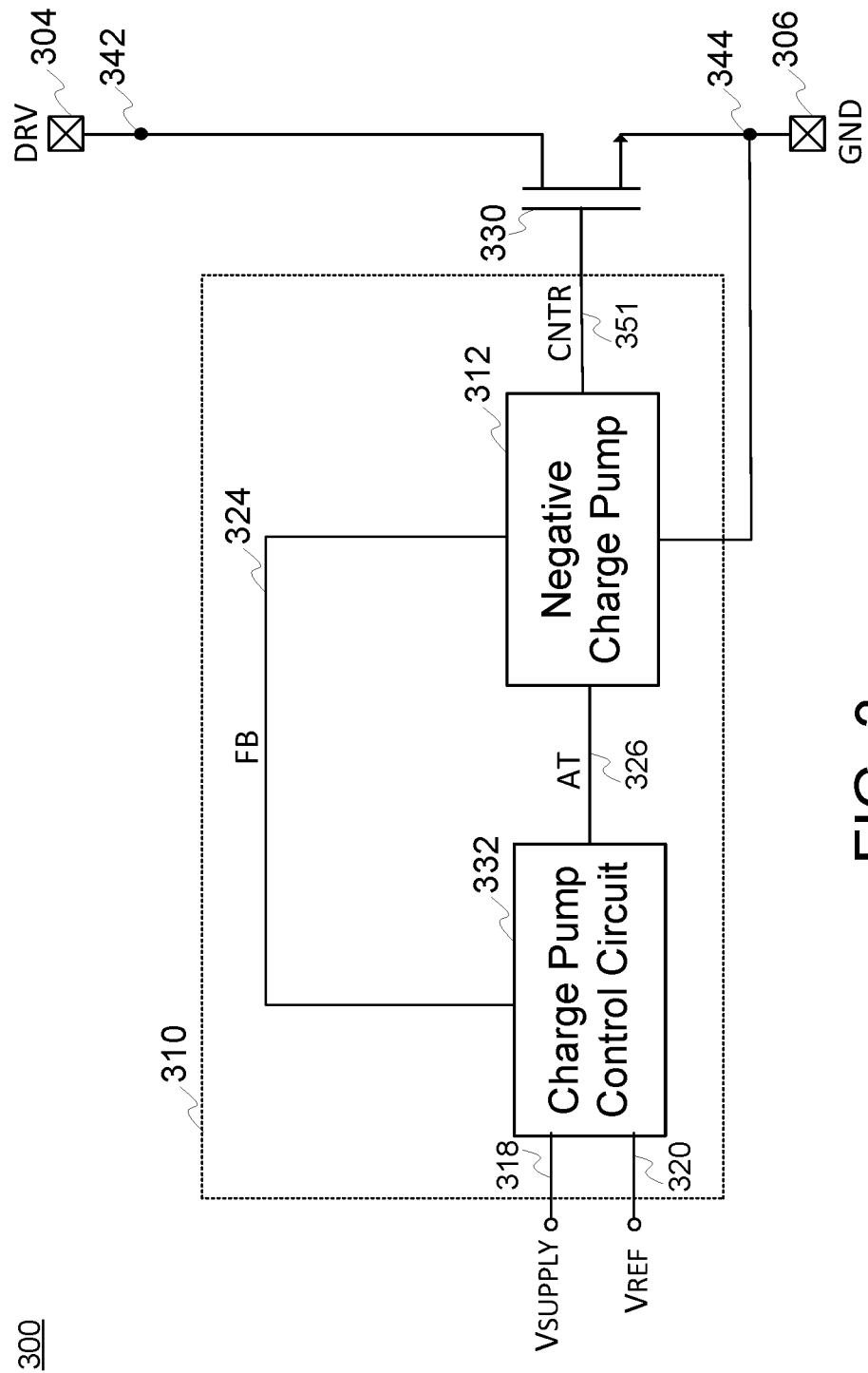
FIG. 3 illustrates a portion of an output driver including a pull-down circuit suitable for use as the pull-down circuit of FIG. 2 according to an embodiment.

FIG. 3 illustrates a portion of an output driver 300 including a pull-down circuit 310 suitable for use as the pull-down circuit 210 of FIG. 2 according to an embodiment. The output driver 300 also includes a switching device 330, a first node 342, a second node 344, a first pad 304, and a second pad 306. In an embodiment, the first pad 304 is coupled to a gate voltage of an external MOSFET switch (see, e.g., switch 250 in FIG. 2). The first and second nodes 342 and 344 are coupled to a drain and a source of the switching device 330, respectively.

The pull-down circuit 310 includes a charge pump control circuit 332 and a negative charge pump 312. The pull-down circuit 310 receives a supply voltage $V_{SUPPLY}$ and a reference signal (e.g., reference voltage) $V_{REF}$, and outputs a control signal (e.g., a control voltage) CNTR to turn on or off the switching device 330 according to the supply and reference voltages $V_{SUPPLY}$ and $V_{REF}$. In an embodiment, the reference voltage $V_{REF}$ includes a plurality of reference voltages.

The charge pump control circuit 332 receives the supply voltage $V_{SUPPLY}$ and the reference voltage $V_{REF}$ through first and second paths 318 and 320, respectively. The charge pump control circuit 332 receives a feedback signal (e.g., a feedback voltage) FB from the negative charge pump 312 through a third path 324.

The charge pump control circuit 332 generates an activation signal AT according to the supply voltage $V_{SUPPLY}$, the reference voltage $V_{REF}$, and the feedback signal FB. The activation signal AT generated is provided to the negative charge pump 312. In an embodiment, the feedback signal FB is substantially the same signal as the control signal CNTR. For example, the charge pump control circuit 332 generates the activation signal AT that causes the negative charge pump 312 to be activated or disabled when the activation signal AT indicates a first logic value (e.g., a logic high value) and a second logic value (e.g., a logic low value), respectively. In another embodiment, the feedback signal FB is a different signal from the control signal CNTR. For example, the charge pump control circuit 332 generates the activation signal AT that causes the negative charge pump 312 to be activated or disabled when the activation signal AT indicates the second logic value and the first logic value, respectively.

The negative charge pump 312 receives the activation signal AT and generates a control signal (e.g., control voltage) CNTR that is negative according to the activation signal AT received. In an embodiment, the negative charge pump 312 decreases the control voltage CNTR when the activation signal AT indicates the logic high value, and the negative charge pump 312 stops decreasing the control voltage CNTR when the activation signal AT indicates the logic low value. In another embodiment, the negative charge pump 312 decreases the control voltage CNTR when the activation signal AT indicates the logic low value, and the negative charge pump 312 stops decreasing the control voltage CNTR when the activation signal AT indicates the logic high value.

Figures 4, 5:
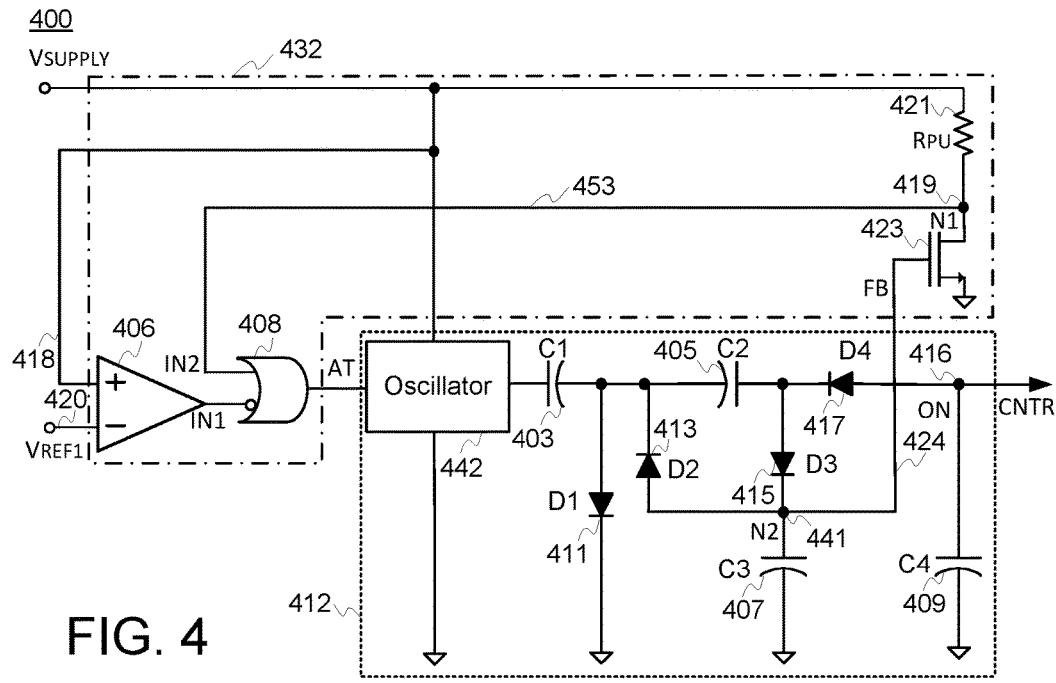
FIG. 4 illustrates a pull-down circuit suitable for use as the pull-down circuit of FIG. 3 according to an embodiment.
FIG. 5 illustrates a pull-down circuit suitable for use as the pull-down circuit of FIG. 3 according to another embodiment.

FIG. 4 illustrates a pull-down circuit 400 suitable for use as the pull-down circuit 310 of FIG. 3 according to an embodiment. The pull-down circuit 400 includes a charge pump control circuit 432 and a negative charge pump 412.

In an embodiment, the charge pump control circuit 432 includes a first comparator 406, a logic gate 408, a switching device (or a first switching device) 423, and a resistor 421. The charge pump control circuit 432 receives a supply voltage $V_{SUPPLY}$, a first reference voltage $V_{REF1}$, and a feedback signal FB, and outputs an activation signal AT to the negative charge pump 412.

The first comparator 406 has a positive terminal connected to a first path 418 and a negative terminal connected to a second path 420. The first comparator 406 compares the supply voltage $V_{SUPPLY}$ and the first reference voltage $V_{REF1}$, and outputs a first input signal IN1 indicative of the comparison result to a logic gate 408. The first reference voltage $V_{REF1}$ has a level sufficiently high to cause an output driver (e.g., the output driver 130 of FIG. 1) to perform one or more of predetermined operations (e.g., synchronization operation, pull-down operation, or the like). In an embodiment, the level of the first reference voltage $V_{REF1}$ is in a range from 2.5 V to 3V.

The first switching device 423 is turned on or off according to the feedback signal FB received from the negative charge pump 412, and pulls down or up a level of a voltage at a node 419 (i.e., a first node N1) connected to a first end of the resistor 421. A second input signal IN2 corresponding to the voltage at the first node N1 indicates a first logic value (e.g., a logic high value) or a second logic value (e.g., a logic low value) according to the feedback signal FB.

In an embodiment, the switching device 423 is a depletion type n-channel MOSFET transistor, which has a negative threshold voltage. In such an embodiment, a drain of the switching device 423 is connected to the first end of the resistor 421, a source of the switching device 423 is connected to a ground, and a gate of the switching device 423 is coupled to the negative charge pump 412.

When the switching device 423 is turned on, the switching device 423 pulls down a voltage level at the first end of the resistor 421, and thus the second input signal IN2 indicates a logic low value. When the switching device 423 is turned off, the voltage level at the first end of the resistor 421 becomes substantially equal to a level of the supply voltage $V_{SUPPLY}$, and thus the second input signal IN2 indicates a logic high value.

The logic gate 408 outputs the activation signal AT according to the first and second input signals IN1 and IN2. In an embodiment, the logic gate 408 is an OR logic gate having one inverted input, and the inverted input receives the first input signal IN1. Thus, the logic gate 408 outputs the activation signal AT indicative of the logic low value that causes the negative charge pump 412 to be activated when the first input signal IN1 has the logic high value and the second input signal IN2 has the logic low value. Otherwise, the logic gate 408 outputs the activation signal AT indicative of the logic high value that causes the negative charge pump 412 to be disabled.

Although the pull-down circuit 410 shown in FIG. 4 includes the OR logic gate 408 having the one inverted input, embodiments of the present disclosure are not limited thereto. In an embodiment (not shown), the first comparator 406 has the positive terminal connected to the second path 420 and the negative terminal connected to the first path 418. In such an embodiment, the logic gate 408 is an OR gate without an inverted input, and thus outputs the activation signal AT indicative of the logic low value when the first and second input signals IN1 and IN2 indicate the logic low value. Otherwise, the logic gate 408 outputs the activation signal AT indicative of the logic high value.

The negative charge pump 412 includes an oscillator 442, first, second, third, and fourth capacitive elements 403, 405, 407, and 409, first, second, third, and fourth diodes 411, 413, 415, and 417, a node 441 (i.e., a second node N2), and a node 416 (i.e., an output node ON). An operation of the negative charge pump 412 will be described below in more detail with reference to FIGS. 6A-6E and FIGS. 3 and 4.

Figures 6A, 6B, 6C, 6D, 6E:
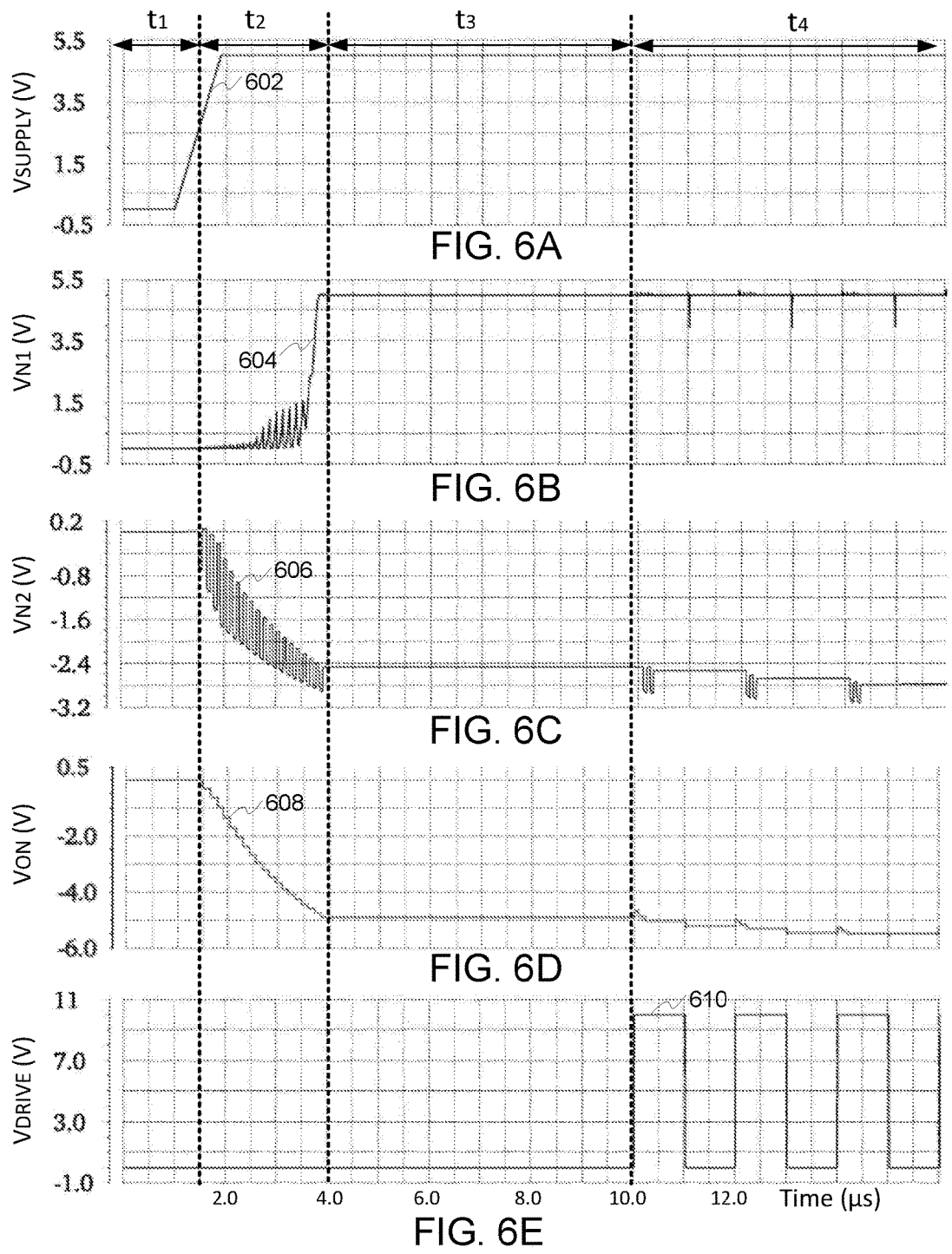
FIG. 6A illustrates a profile of a supply voltage according to an embodiment.
FIG. 6B illustrates a profile of a voltage at a first node according to an embodiment.
FIG. 6C illustrates a profile of a voltage at a second node according to an embodiment.
FIG. 6D illustrates a profile of a voltage at an output node according to an embodiment.
FIG. 6E illustrates a profile of an output voltage of an output driver according to an embodiment.

FIGS. 6A-6E illustrate profiles related to an operation of the negative charge pump 412 of FIG. 4 according to an embodiment. Specifically, FIG. 6A illustrates a profile 602 of the supply voltage $V_{SUPPLY}$; FIG. 6B illustrates a profile 604 of a voltage $V_{N1}$ at the first node N1; FIG. 6C illustrates a profile 606 of a voltage $V_{N2}$ at the second node N2; FIG. 6D illustrates a profile 608 of a voltage $V_{ON}$ at the output node ON; FIG. 6E illustrates a profile 610 of an output voltage of an output driver (e.g., the output driver 130 of FIG. 1, 200 of FIG. 2, or 300 of FIG. 3).

During a first time interval $t_1$, the supply voltage $V_{SUPPLY}$ has a level lower than a level of the first reference voltage $V_{REF1}$, and thus the first comparator 406 outputs the first input signal IN1 indicative of the logic low value. Because the first switching device 423 has a negative threshold voltage, the first switching device 423 is turned on and pulls down the voltage $V_{N1}$ at the first node N1, as shown in FIG. 6B. Thus, the second input signal IN2 corresponding to the voltage $V_{N1}$ at the first node N1 indicates the low logic value. The logic gate 408 performs an OR operation on an inverted version of the first signal IN1 and the second input signal IN2, and outputs the activation signal AT indicative of the logic high value that causes the negative charge pump 412 to be disabled. Because the negative charge pump 412 does not operate, as shown in FIG. 6D, the voltage $V_{ON}$ at the output node ON remains substantially the same. The voltage $V_{ON}$ at the output node ON is greater than a negative threshold voltage of a second switching device (e.g., the switching device 330 of FIG. 3) coupled to the output node ON, and thus the second switching device is turned on.

In an embodiment, during the first time interval $t_1$, the control voltage CNTR at the output node ON is substantially equal to 0 V. In such an embodiment, the control voltage CNTR is applied to a gate of the switching device, and thus an amount of a drain-source current $I_{DS}$ flowing through the switching device is represented by the following Equation:

$$I_{DS} = \frac{1}{2}k'_n\frac{W}{L}V_t^2.$$

In the above Equation, $k'_n$ denotes a process transconductance parameter of the switching device, W denotes a width of a channel in the switching device, L denotes a length of the channel in the switching device, and $V_t$ is a threshold voltage of the switching device. When a gate of an external MOSFET switch (e.g., the switch 150 of FIG. 1) is connected to a drain of the switching device, the drain-source current $I_{DS}$ can be used to pull down the gate voltage of the external MOSFET switch. As indicated in the above Equation, the amount of the drain-source current $I_{DS}$ can be changed by adjusting a design parameter (e.g., a width-to-length ratio W/L) of the switching device.

During a second time interval $t_2$, the level of the supply voltage $V_{SUPPLY}$ exceeds the level of the first reference voltage $V_{REF1}$, and thus the first comparator 406 outputs the first input signal IN1 indicative of the logic high value. Because the first switching device 423 remains conductive to pull down the voltage $V_{N1}$ at the first node N1, the second input signal IN2 indicates the logic low value. Because the first input signal IN1 has the logic high value and the second input signal N2 has the logic low value, the logic gate 408 (e.g., the OR gate with the one inverted input) outputs the activation signal AT indicative of the logic low value that causes the negative charge pump 412 to be activated. As a result, the negative charge pump 412 produces a negative voltage across the fourth capacitor C4.

When the oscillator 442 receives the activation signal AT indicative of the logic low value, the oscillator 442 generates a periodic and oscillating signal. When an output signal of the oscillator 442 indicates the logic high value, the first and third diodes 411 and 415 are turned on. Thus, a first end of the first capacitor 403 is connected to a first end of the first diode 411 and a first end of the second capacitor 405. A second end of the second capacitor 405 is connected to a first end of the third diode 415, and a second end of the third diode 415 is connected to a first end of the third capacitor 407. A second end of the third capacitor 407 and a second end of the first diode 411 are connected to a ground. When the output signal of the oscillator 442 indicative of the logic high value is applied to a second end of the first capacitor 403, the second capacitor 405 is charged such that the second end of the second capacitor 405 has a first negative voltage, and the third capacitor 407 is charged such that the first end of the third capacitor 407 has a second negative voltage corresponding to the voltage $V_{N2}$ at the second node N2.

Subsequently, when the output signal of the oscillator 442 indicates the logic low value, the second and fourth diodes 413 and 417 are turned on. The first end of the first capacitor 403 is connected to the first end of the second capacitor 405 and is coupled to the first end of the third capacitor 407 through the second diode D2. The second end of the second capacitor 405 is coupled to a first end of the fourth capacitor 409 through the fourth diode 417. A second end of the fourth capacitor 409 is connected to the ground. When the output signal of the oscillator 442 indicative of the logic low value is applied to the second end of the first capacitor 403, the second capacitor 405 is charged such that the second end of the second capacitor 405 becomes more negative compared to when the output signal indicates the logic high value, and the fourth capacitor 409 is charged such that the first end of the fourth capacitor 409 has a third negative voltage corresponding to the voltage $V_{ON}$ at the output node ON.

Accordingly, as a number of cycles of the output signal from the oscillator 442 increases, the voltage $V_{N2}$ at the second node N2 and the voltage $V_{ON}$ at the output node ON decreases, as shown in FIGS. 6C and 6D, respectively. At the end of the second time interval $t_2$, the voltage $V_{N2}$ at the second node N2 becomes sufficiently negative to turn off the first switching device 423, and the voltage $V_{ON}$ at the output node ON has an absolute magnitude that is substantially two times as large as an absolute magnitude of the voltage $V_{N2}$ at the second node N2. Because the voltage $V_{ON}$ at the output node ON has a more negative value than the voltage $V_{N2}$ at the second node N2, when the first switching device 423 is turned off, the voltage $V_{ON}$ at the output node ON is sufficiently low to turn off the second switching device (e.g., the switching device 330 of FIG. 3) connected to the output node ON. Thus, a precise matching between the first switching device 423 and the second switching device may not be required, resulting in sufficient design margin for fabricating the first switching device 423 and the second switching device.

During the first and second time intervals $t_1$ and $t_2$, the voltage $V_{ON}$ at the output node ON is not sufficiently low to turn off the second switching device (e.g., the switching device 330 of FIG. 3) connected to the output node ON. As a result, the second switching device remains turned on and pulls down the gate voltage of an external MOSFET device (e.g., the MOSFET switch 250 of FIG. 2) preventing its premature turn-on, which would result in current leakage and power loss.

During a third time interval $t_3$, the first switching device 423 remains turned off and non-conductive. The voltage $V_{N1}$ at the first node N1 is pulled up as shown in FIG. 6B, and thus the second input signal IN2 indicates the logic high value. Because the first input signal IN1 also indicates the logic high value, the logic gate 408 outputs the activation signal AT indicative of the logic high value, resulting in stopping the operation of the negative charge pump 412.

Referring to FIGS. 6A, 6D, and 6E, during the first time interval $t_1$, the supply voltage $V_{SUPPLY}$ has a level lower than the level of the first reference voltage $V_{REF1}$, the output driver (e.g., the output driver 200 of FIG. 2 or 300 of FIG. 3) pulls down the gate voltage of the external MOSFET device (e.g., the MOSFET switch 250 of FIG. 2), and the external MOSFET device is placed in a power-off mode. During the second time interval $t_2$, the second switching device remains turned on and the output driver continues to pull down the gate voltage of the external MOSFET device, and the external MOSFET device is placed in an intermediate mode. In an embodiment, the output driver including a pull-down circuit (e.g., the pull-down circuit 310, 400) pulls down a voltage level of the gate of the external MOSFET device to prevent a premature turn-on, e.g., while the external MOSFET device is in a power-off mode or an intermediate mode.

During the third time interval $t_3$, the output driver stops pulling down the gate voltage of the external MOSFET device, and the MOSFET device transitions to a power-on mode. During a fourth time interval $t_4$, the output driver provides a drive signal (e.g., the input signal IS of FIG. 1) to the gate of the external MOSFET device (e.g., the MOSFET switch 250 of FIG. 2) through a pad (e.g., the first pad 204 of FIG. 2), and the MOSFET device is in the power-on mode. In an embodiment, the external MOSFET device is used as a power switch in a synchronous rectifier (SR) power regulator.

FIG. 5 illustrates a pull-down circuit 500 suitable for use as the pull-down circuit 310 of FIG. 3 according to an embodiment. The pull-down circuit 500 includes a charge pump control circuit 532 and a negative charge pump 512.

In an embodiment, the charge pump control circuit 532 includes a first comparator 506, a logic gate 508, and a second comparator 514. The charge pump control circuit 532 receives a supply voltage $V_{SUPPLY}$, a first reference voltage $V_{REF1}$, and a second reference voltage $V_{REF2}$, and outputs an activation signal AT to the negative charge pump 512.

The first comparator 506 has a positive terminal connected to a first path 518 and a negative terminal connected to a second path 520. The first comparator 506 compares the supply voltage $V_{SUPPLY}$ and the first reference voltage $V_{REF1}$, and outputs a first input signal IN1 indicative of the comparison result to the logic gate 508.

The second comparator 514 has a positive terminal connected to a third path 524 and a negative terminal connected to a fourth path 522. The second comparator 514 compares a control signal (or a control voltage) CNTR and the second reference voltage $V_{REF2}$, and outputs a second input signal IN2 indicative of the comparison result to the logic gate 508. The second reference voltage $V_{REF2}$ has a level that is substantially equal to a threshold voltage of a switching device (e.g., the switching device 330 of FIG. 3).

The logic gate 508 outputs the activation signal AT according to the first and second input signals IN1 and IN2. In an embodiment, the logic gate 508 is an AND logic gate, and thus outputs the activation signal AT indicative of a first logic value (e.g., a logic high value) that causes the negative charge pump 512 to be activated when the first and second input signals IN1 and IN2 are indicative of the logic high value. Otherwise, the logic gate 508 outputs the activation signal AT indicative of a second logic value (e.g., a logic low value) that causes the negative charge pump 512 to be disabled.

The negative charge pump 512 includes an oscillator 542, first, second, third, and fourth capacitive elements 503, 505, 507, and 509, first, second, third, and fourth diodes 511, 513, 515, and 517, and a node 516 (i.e., an output node ON). The negative charge pump 512 outputs the control signal CNTR to a switching device (e.g., the switching device 330 of FIG. 3) that performs a pull-down operation. The negative charge pump 512 also outputs the control signal CNTR as a feedback signal FB to the positive terminal of the second comparator 514 through the third path 524.

During a first time interval, the supply voltage $V_{SUPPLY}$ has a level lower than a level of the first reference voltage $V_{REF1}$, and thus the first comparator 506 outputs the first input signal IN1 indicative of the logic low value. The control voltage CNTR is higher than the second reference voltage $V_{REF2}$, which is a negative threshold voltage of the switching device (e.g., the switching device 330 of FIG. 3), and thus the second comparator 514 outputs the second input signal IN2 indicative of the logic high value. The logic gate 508 performs an AND operation on the first and second input signals IN1 and IN2, and thus outputs the activation signal AT indicative of the logic low value that causes the negative charge pump 512 to be disabled.

During a second time interval, the level of the supply voltage $V_{SUPPLY}$ exceeds the level of the first reference voltage $V_{REF1}$, and thus the first comparator 506 outputs the first input signal IN1 indicative of the logic high value. Because the second comparator 514 outputs the second input signal IN2 indicative of the logic high value, the logic gate 508 outputs the activation signal AT indicative of the logic high value that causes the negative charge pump 512 to be activated. As a result, the negative charge pump 512 produces a negative voltage across the fourth capacitor C4. The negative charge pump 512 increases an absolute magnitude of the negative voltage until the control voltage CNTR at the output node ON becomes less than the second reference voltage $V_{REF2}$. An operation of the negative charge pump 512 is similar to that of the negative charge pump 412 described above with reference to FIGS. 4 and 6A-6E, and thus detailed descriptions of the operation of the negative charge pump 512 will be omitted herein for the interest of brevity.

During the first and second time intervals, the control voltage CNTR at the output node ON is not sufficiently low to turn off the switching device (e.g., the switching device 330 of FIG. 3 or 230 of FIG. 2) having the gate connected to the output node ON. As a result, the switching device remains turned on and pulls down the gate voltage of the external MOSFET (e.g., the MOSFET switch 250 of FIG. 2) having the gate connected to the drain of the switching device.

During a third time interval, the control voltage CNTR at the output node ON is less than the level of the second reference voltage $V_{REF2}$, which is the threshold voltage of the switching device having the gate connected to the output node ON, and the switching device is turned off and becomes non-conductive. As a result, the switching device stops pulling down the gate voltage of the external MOSFET. Thus, when the switching device does not perform the pull down operation, an amount of a leakage current flowing through the switching device is smaller than that of a current flowing through a conventional pull-down resistor, resulting in less power consumption of the output driver according to an embodiment.

Figure 7:
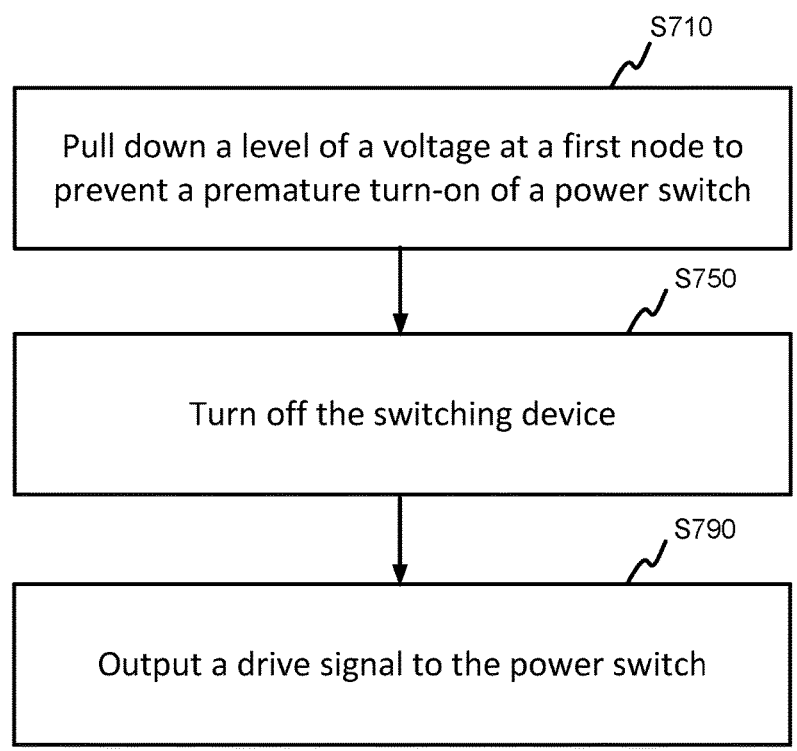
FIG. 7 illustrates a process performed by an output driver according to an embodiment.

FIG. 7 is a flowchart 700 that illustrates a process performed by an output driver according to an embodiment. In an embodiment, the output driver includes a switching device (e.g., the switching device 230 of FIG. 2) and a pull-down circuit (e.g., the pull-down circuit 210 of FIG. 2), and the switching device includes a node coupled to a gate of a power switch (e.g., the MOSFET switch 250 of FIG. 2).

At S710, the output driver pulls down a level of a voltage at the node (e.g., the first node 242 of FIG. 2) coupled to the gate of the power switch, to prevent a premature turn-on of the power switch while the power switch is not in a power-on mode. For example, the output driver pulls down the level of the gate voltage while the power switch is in a power-off mode corresponding to a first time interval (e.g., the first time interval $t_1$ of FIG. 6A) and while the power switch is in an intermediate mode corresponding to a second time interval (e.g., the second time interval $t_2$ of FIG. 6A) using the switching device. In an embodiment, the switching device is a depletion type NMOSFET, and is turned off during the first and second time intervals.

At S750, the output driver turns off the switching device using the pull-down circuit while the power switch transitions to or is in the power-on mode. For example, the output driver turns off the switching device during a third time interval (e.g., the third time interval $t_3$ of FIG. 6A) and a fourth time interval (e.g., the fourth time interval $t_4$ of FIG. 6A). In an embodiment, the pull-down circuit outputs a control voltage (e.g., the control signal CNTR of FIG. 2) that is substantially equal to or less than a threshold voltage of the switching device to turn off the switching device.

At S790, the output driver outputs a drive signal (e.g., the input signal IS of FIG. 1) to drive the power switch using a different portion from the pull-down circuit. For example, the output driver causes the power switch to turn on or off according to the drive signal during the fourth time interval (e.g., the fourth time interval $t_4$ of FIG. 6A).

Aspects of the present disclosure have been described in conjunction with the specific embodiments thereof that are proposed as examples. Numerous alternatives, modifications, and variations to the embodiments as set forth herein may be made without departing from the scope of the claims set forth below. Accordingly, embodiments as set forth herein are intended to be illustrative and not limiting.

What is claimed is:

1. An output driver, comprising:
    a switching device having a first node coupled to a gate of a power switch and pulling down a voltage level of the gate of the power switch to prevent a premature turn-on of the power switch; and
    a pull-down circuit coupled to the switching device and controlling the switching device to prevent the premature turn-on of the power switch,
    wherein the switching device includes a depletion type n-channel metal-oxide-semiconductor field-effect transistor having a drain coupled to the first node.

2. The output driver of claim 1,
    wherein the pull-down circuit turns off the switching device when the power switch is in or transitions to a power-on mode.

3. The output driver of claim 2, wherein the pull-down circuit includes:
    a control circuit generating an activation signal based on a supply voltage, a first reference voltage, and a feedback signal; and
    a negative charge pump generating a control signal according to the activation signal and outputting the control signal to the switching device.

4. The output driver of claim 3, wherein the feedback signal is the control signal, and
    wherein the control circuit includes:
    a first comparator comparing the supply voltage and the first reference voltage to output a first input signal;
    a second comparator comparing the feedback signal with a second reference voltage to output a second input signal; and
    a logic gate performing a logical operation on the first and second input signals to output the activation signal.

5. The output driver of claim 4, wherein the power switch is in a power-off mode when the supply voltage is less than the first reference voltage and the power switch is in an intermediate mode at a time interval between the power-off mode and the power-on mode, and
    wherein preventing the premature turn-on of the power switch by the switching device involves keeping the power switch off during the power-off mode and the intermediate mode.

6. The output driver of claim 5, wherein the logic gate is an AND logic gate, and wherein the logic gate outputs the activation signal indicative of a logic high value while the power switch is in the intermediate mode, and outputs the activation signal indicative of a logic low value while the power switch is in the power-off mode or the power-on mode.

7. The output driver of claim 3, wherein the switching device is a first switching device, and
    wherein the control circuit includes:
    a first comparator comparing the supply voltage and the first reference voltage to output a first input signal;
    a second switching device coupled between a second node and a ground and receiving the feedback signal, a voltage at the second node corresponding to a second input signal;
    a resistor coupled between the supply voltage and the second node; and
    a logic gate performing a logical operation on an inverted version of the first input signal and the second input signal to output the activation signal.

8. The output driver of claim 7, wherein the power switch is in a power-off mode when the supply voltage is less than the first reference voltage and the power switch is in an intermediate mode at a time interval between the power-off mode and the power-on mode, and
    wherein the logic gate outputs the activation signal indicative of a logic low value while the power switch is in the intermediate mode, and outputs the activation signal indicative of a logic high value while the power switch is in the power-off mode or the power-on mode.

9. The output driver of claim 7, wherein the negative charge pump causes an absolute magnitude of the control signal to be substantially two times as large as an absolute magnitude of the feedback signal at the end of the intermediate mode.

10. The output driver of claim 9, wherein the second switching device is a depletion type n-channel metal-oxide-semiconductor field-effect transistor.

11. The output driver of claim 9, wherein the negative charge pump includes:
    an oscillator coupled to the logic gate and generating an oscillating signal;
    a first capacitor coupled to the oscillator;
    a first diode coupled between the first capacitor and the ground;
    a second diode coupled between the first capacitor and a third node, the third node being coupled to a gate of the second switching device;
    a second capacitor coupled to the second diode;
    a third diode coupled between the second capacitor and the third node;

a third capacitor coupled between the third node and the ground;

a fourth capacitor coupled between a fourth node and the ground, a voltage at the fourth node corresponding to the control signal; and a fourth diode coupled between the second capacitor and the fourth node.

12. The output driver of claim 3, wherein the control signal is a control voltage, and wherein the negative charge pump decreases the control voltage until the control voltage becomes substantially equal to a threshold voltage of the switching device.

13. The output driver of claim 3, wherein the output driver is included in a controller, the controller being in a package.

14. The output driver of claim 1, wherein the pull-down circuit includes a charge pump generating a control voltage in response to an activation signal and outputting the control voltage to the switching device.

15. An apparatus, comprising:
a controller; and
an output driver including
   a switching device having a first node coupled to a gate of a power switch and pulling down a voltage level of the gate of the power switch to prevent a premature turn-on of the power switch, and
   a pull-down circuit coupled to the switching device and controlling the switching device to prevent the premature turn-on of the power switch,
wherein the pull-down circuit includes:
   a control circuit generating an activation signal based on a supply voltage, a first reference voltage, and a feedback signal; and
   a negative charge pump generating a control signal according to the activation signal and outputting the control signal to the switching device.

16. A method for controlling an output driver, the method comprising:
pulling down a level of a voltage at a first node to prevent a premature turn-on of a power switch coupled to the output driver, the first node being coupled to a switching device and a gate of the power switch;

controlling the switching device using a pull-down circuit; and outputting a driving signal to the power switch, wherein controlling the switching device comprises:
   generating an activation signal based on a supply voltage, a first reference voltage, and a feedback signal; and
   generating a control signal according to the activation signal and outputting the control signal to the switching device.

17. The method of claim 16, further comprising:
increasing a level of the supply voltage until the level of the supply voltage becomes substantially equal to a level of the first reference voltage while the power switch is in a power-off mode.

18. The method of claim 16, wherein the feedback signal is the control signal, the method further comprising:
comparing the supply voltage and the first reference voltage to output a first input signal;
comparing the feedback signal with a second reference voltage to output a second input signal; and
performing a logical operation on the first and second input signals to output the activation signal.

19. The method of claim 16, wherein the switching device is a first switching device, the method further comprising:
comparing the supply voltage and the first reference voltage to output a first input signal;
generating a second input signal using a second switching device according to the feedback signal; and
performing a logical operation on an inverted version of the first signal and the second input signal to output the activation signal.

20. The method of claim 19, wherein the power switch is in a power-off mode when the supply voltage is less than the first reference voltage and the power switch is in an intermediate mode at a time interval between the power-off mode and the power-on mode, the method further comprising:
causing an absolute magnitude of the control signal to be substantially two times as large as an absolute magnitude of the feedback signal at the end of the intermediate mode.

* * * * *